United States Patent [19]

Nei et al.

[11] Patent Number: 4,787,061

[45] Date of Patent: Nov. 22, 1988

[54] DUAL DELAY MODE PIPELINED LOGIC SIMULATOR

[75] Inventors: Chu C. Nei, San Jose; Dan R. Hafeman, Sunnyvale; William Fazakerly, Saratoga, all of Calif.

[73] Assignee: Ikos Systems, Inc., Sunnyvale, Calif.

[21] Appl. No.: 878,459

[22] Filed: Jun. 25, 1986

[51] Int. Cl.[4] .......................... G06F 9/38; G06F 9/44
[52] U.S. Cl. ..................................... 364/900; 371/23; 364/140
[58] Field of Search ... 364/200 MS File, 900 MS File, 364/140, 146, 147, 148, 149; 371/23

[56] References Cited

U.S. PATENT DOCUMENTS

| | | | |
|---|---|---|---|
| 3,932,843 | 1/1976 | Trelut | 371/23 |
| 4,306,286 | 12/1981 | Cocke et al. | 364/200 |
| 4,313,200 | 1/1982 | Nishiura | 364/200 |
| 4,342,093 | 7/1982 | Miyoshi | 364/578 |
| 4,527,249 | 7/1985 | Van Brunt | 364/578 |
| 4,584,642 | 4/1987 | Hitchcock, Sr. et al. | 364/200 |
| 4,654,851 | 3/1987 | Busby | 371/23 |
| 4,656,580 | 4/1987 | Hitchcock, Sr. et al. | 364/200 |
| 4,656,632 | 4/1987 | Jackson | 364/580 |
| 4,675,832 | 6/1987 | Robinson et al. | 364/521 |
| 4,725,971 | 2/1988 | Doshi et al. | 364/200 |
| 4,725,975 | 2/1988 | Sasaki | 364/900 |
| 4,751,637 | 6/1988 | Catlin | 364/200 |

OTHER PUBLICATIONS

M. Denneau, "Logic Processor for Logic Simulation Machine", IBM Technical Disclosure Bulletin, vol. 25, No. 1, Jun. 1982.

"Use of the Boeing Computer Simulator for Logic Design Confirmation and Failure Diagnostic Programs", A. W. Van Ausdal, Aeronautical Sci., 6/71.

Primary Examiner—Archie E. Williams, Jr.
Assistant Examiner—Eric Coleman
Attorney, Agent, or Firm—Walter J. Madden, Jr.; Alan H. MacPherson; Paul J. Winters

[57] ABSTRACT

Logic simulation is performed using special purpose hardware which operates in either one of two simulation modes. The machine allows detailed timing simulation where each device may be programmed with a delay time of zero, one, or multiple simulation time units. In addition, the machine supports zero and unit delay simulation in a high performance "unit delay" mode. The logic simulation function is partitioned into six sub-functions which are implemented in a single stage of a six-stage pipeline. The pipeline stages which implement the multi-unit delay time queue management may be switched to perform a different algorithm for unit delay simulation. The machine is able to perform extremely fast functional circuit testing and to perform detailed timing simulation without changing the circuit "netlist".

4 Claims, 2 Drawing Sheets

DUAL DELAY MODE PIPELINED LOGIC SIMULATOR

CROSS REFERENCE TO RELATED APPLICATIONS

1. "Stimulus Engine for a Logic Simulation System," filed June 25, 1986, Ser. No. 878,458, and assigned to the same assignee as the present invention.

2. "Glitch Detecting Logic Evaluator," filed June 26, 1986, Ser. No. 878,552, and assigned to the same assignee as the present invention.

BACKGROUND OF THE INVENTION

Logic simulators enable a logic circuit to be modeled and circuit behavior to be predicted without the construction of the actual circuit. As circuit complexity increases, the time required for logic simulation also increases. In many cases, a logic simulation run must be performed numerous times as the designer searches for a design problem. Most often, these design problems are functional in nature and detailed timing information is not necessary during the successive simulation runs. However, once the functional problems have been located and corrected, the designer needs to be able to perform logic simulation with detailed timing information. If the timing simulation is performed on the same "netlist" with the same simulator as was used for the unit delay simulation, the possibility of translation error is eliminated. The present invention allows the functional errors to be located with extremely fast "unit delay" mode simulation and allows detailed timing simulation to be performed on the same circuit "netlist" and device models.

Prior art logic simulation systems have been designed to operate in either a unit delay mode as described in U.S. Pat. No. 4,306,286 to Cocke et al, or a time wheel simulation mode as described in U.S. Pat. No. 4,656,580 to Hitchcock et al. The time wheel simulators are able to handle devices with unit delay, however, there is no significant performance improvement when all of the devices in a logic circuit are unit delay. This is due to the fact that the prior art time wheel simulators treat the unit delay devices in the same manner as multiple unit delay devices. The present invention supports a time queue management algorithm which is optimized for unit delay without sacrificing the ability to perform detailed timing simulation. The circuit designer is able to select between the unit delay mode for fast functional simulation, and the multiple unit delay mode for detailed timing simulation.

SUMMARY OF THE INVENTION

It is an object of the present invention to provide a logic simulation accelerator which permits two modes of operation in a single architecture, namely a unit delay mode of operation and a time wheel mode of operation.

The logic simulation accelerator includes first means for simulating a unit delay logic mode of operation, second means for simulating a time wheel mode of operation and control means for controlling (or switching) between the first and second simulation means to permit one or the other of the two modes of operation.

In a preferred embodiment, the present invention includes a multi-stage pipeline architecture for the two modes of operation. The operation of pipeline stages depends on which of the first or second modes of operation is selected.

Other objects, features and advantages of the present invention will become apparent from the following detailed description when taken in conjunction with the accompanying drawings.

DETAILED DESCRIPTION OF THE DRAWINGS

Figure 1:
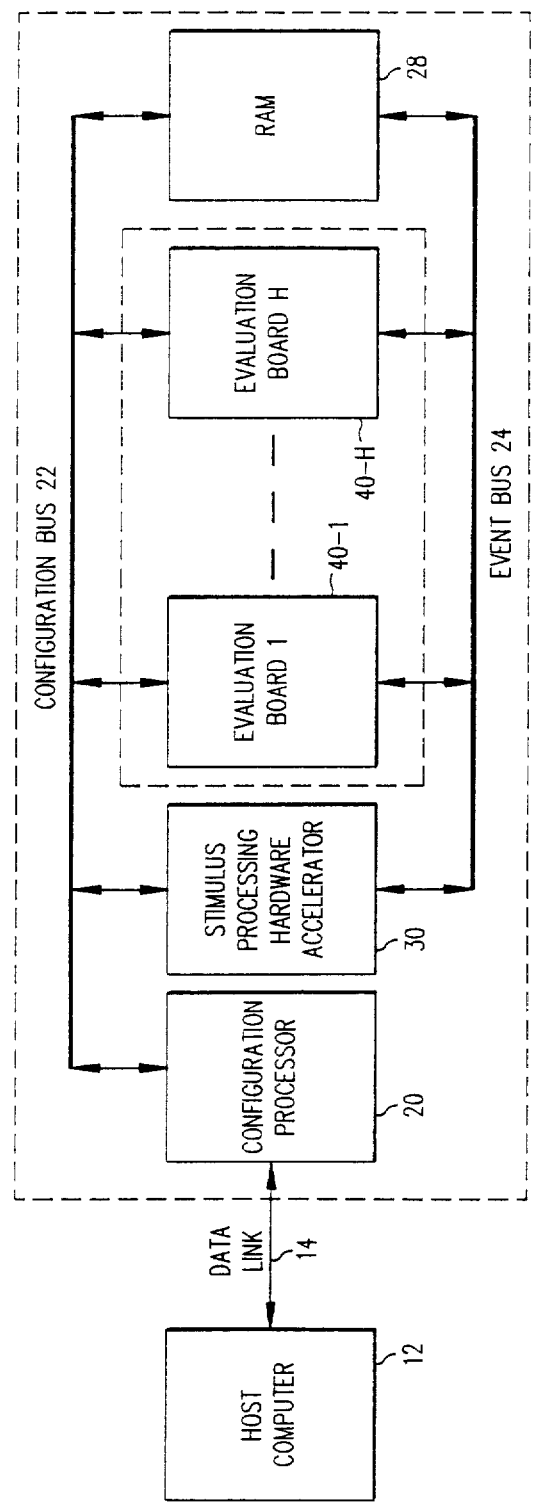
FIG. 1 depicts a block diagram of a logic simulation system which includes a dual mode logic simulation accelerator according to the present invention.

Referring now to FIG. 1, a block diagram of a logic simulator system 10 is depicted, which is connected to a suitable host computer 12 via a high speed serial data link 14. The logic simulator system 10 includes a configuration processor 20 which communicates by a configuration bus 22 to the other components depicted in the system 10.

The logic simulator system 10 includes a stimulus processing hardware accelerator 30 which is connected to an event bus 24. The stimulus accelerator 30 provides high-speed presentation of stimulus programs and run-time comparison of simulation outputs to expected outputs.

Referring again to FIG. 1, the configuration processor 30 communicates to a plurality of evaluator boards such as evaluator board 40-1 through 40-N. In a preferred embodiment, the logic simulator system 10 includes up to 15 evaluator boards, although other variations are possible.

The logic simulator system 10 also includes a local random access memory (RAM) 28.

The configuration processor is connected to the accelerator 30, evaluator boards 40 and RAM 28 via the configuration bus 22. The accelerator 30, evaluator boards 40 and RAM 28 also communicate via the event bus 24.

The logic simulator system 10 of FIG. 1 includes hardware accelerators linked together and configured by user interface software running on the host computer 12. Complex hierarchical stimulus programs incorporating sophisticated programmatic constructs such as data substitution, looping and synchronization, can be entered graphically on the host computer 12. These stimulus programs are interpreted by the stimulus processing hardware accelerator 30 at simulation run-time and fed directly through event bus 24 to the logic simulation hardware accelerator (which is comprises of the evaluator boards 40). This approach allows dense storage of stimulus vectors to insure that disk accesses are not required during comprehensive simulation runs. Further details of the stimulus accelerator are described in the above identified cross-referenced application entitled "Stimulus Engine for a Logic Simulation System," the details of which are hereby incorporated by reference.

As depicted in FIG. 1, a logic simulation hardware accelerator according to the present invention is comprises of evaluator boards, such as boards 40-1 through 40-N. Each evaluator board is capable of simulating up to 16K four-input, one-output primitive logic elements at speeds of approximately 500,000 events per second in timing mode, and 5,000,000 events per second in unit delay mode. In addition to 16K primitive logic elements, each evaluator board 40 allows a user to model up to 64K bits of RAM or ROM. The system 10 depicted in FIG. 1 can be configured with up to 15 evaluator boards 40. Of course, configuring up to 15 evaluator boards in system 10 of FIG. 1 is for description purposes only, and the scope of the present invention should not be limited to the number or primitive capacity of evaluator boards used in a particular system.

Event driven logic simulators, whether implemented in software or hardware, represent logic activity as a series of "events." These events consist of a net address, a time parameter, and a new logic state for the net. Every net (or node) has a driving device and a unique net address. The time parameter may be in absolute time or a time interval relative to a previous event. The logic state is typically made up of three or more values and three or more strengths. Typical values are logic zero, logic one and undefined. Typical strengths are driving, resistive, and high impedance. In the described embodiment, each evaluator primitive element can be modeled with up to 16 logic states, and the logic function of each primitive element is user definable. In the timing mode of operation, each primitive element supports up to four independent input-to-output delays. The detailed timing behavior of each primitive element can be modeled in one of three modes: pulse pass (rise time equal fall time), pulse suppress (glitches suppressed) or pulse amplify (glitches amplified and displayed). Timing mode operation is discussed in more detail in the above identified cross-referenced patent application entitled "Glitch Detecting Logic Evaluator," the details of which are hereby incorporated by reference.

Figures 2, 2A:
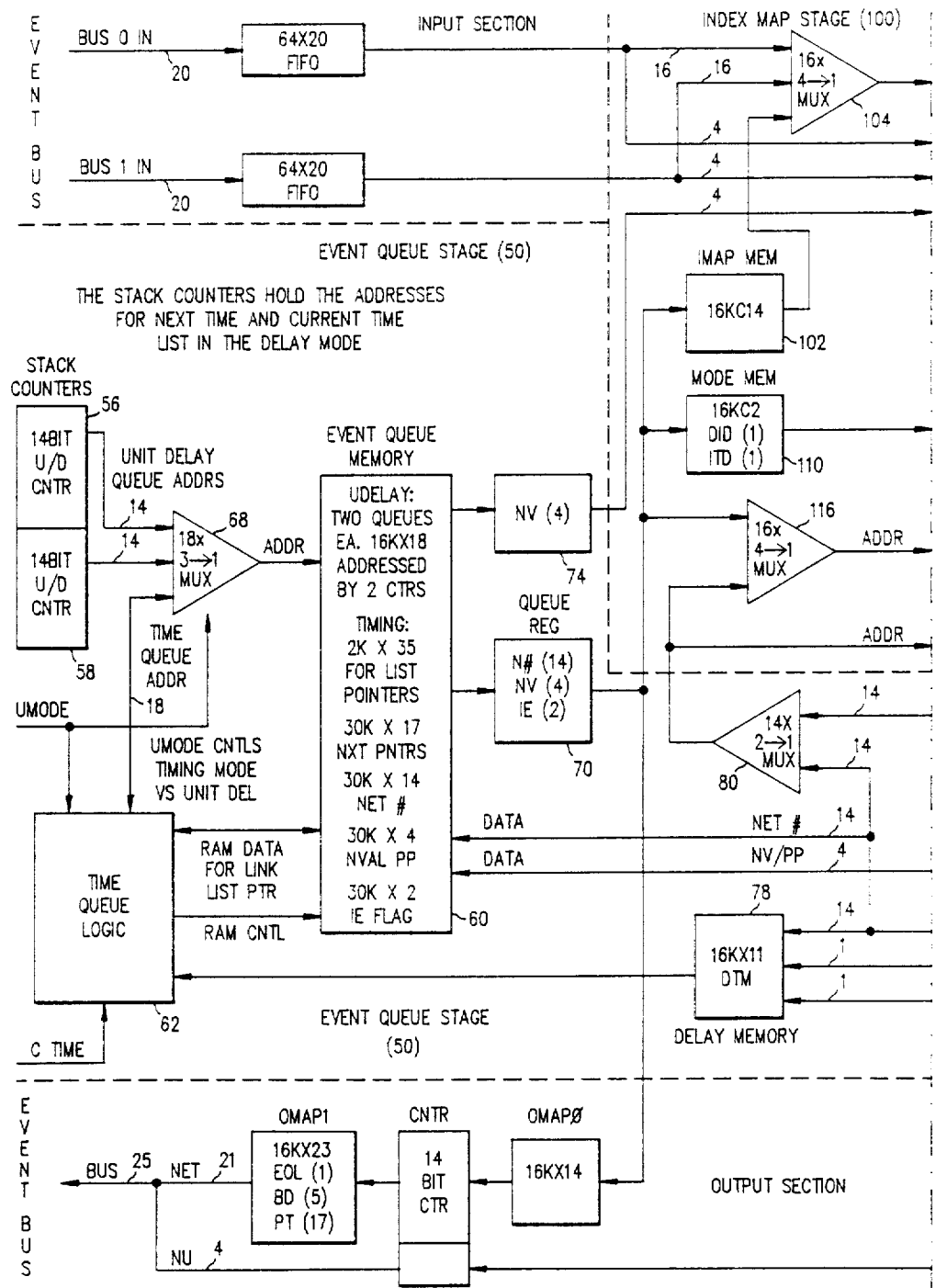
FIG. 2 depicts a block diagram of a multi-stage variable length pipeline architecture according to the present invention, which forms a portion of FIG. 1.
Figure 2B:
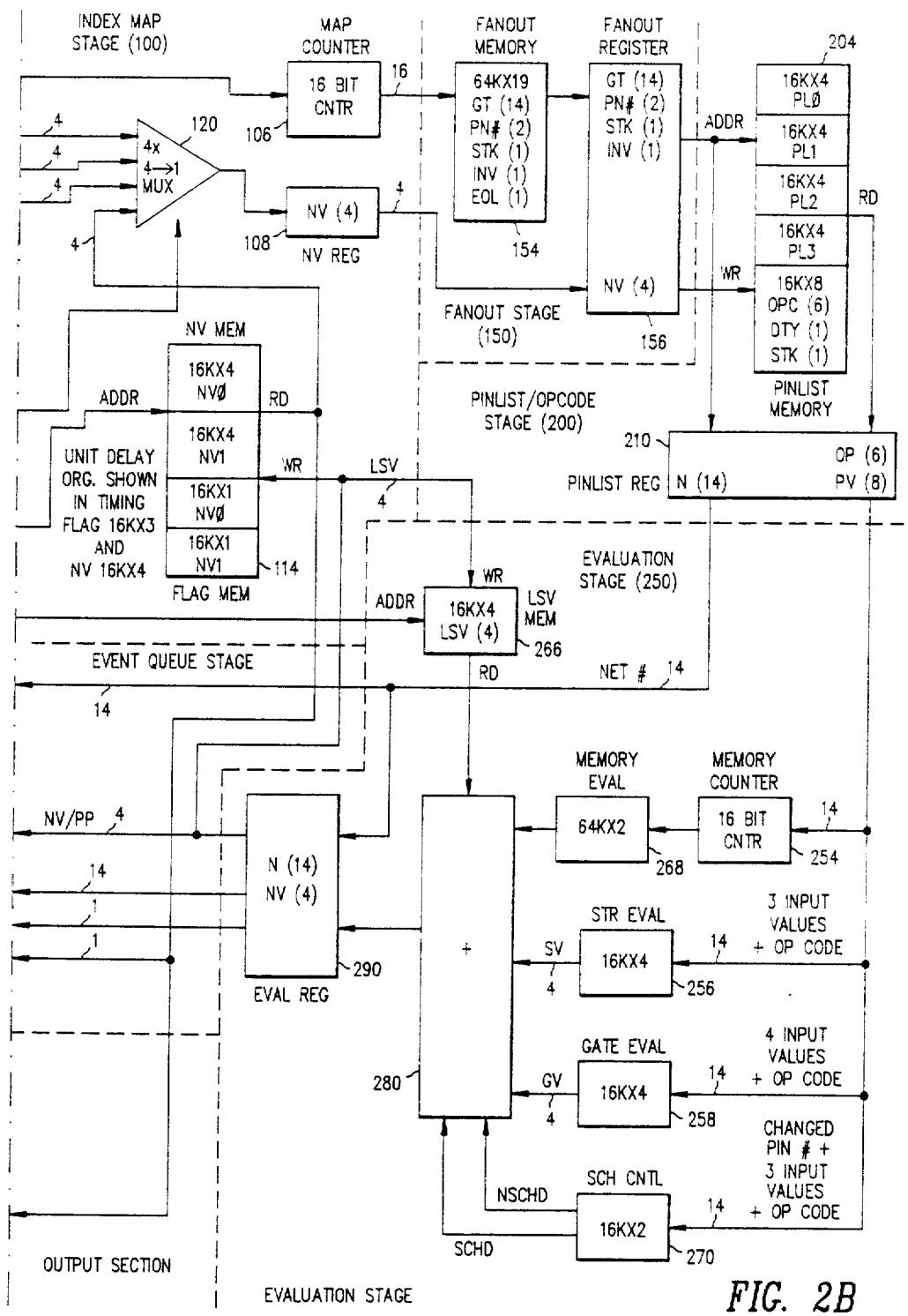

Referring now to FIG. 2, a block diagram of one of the evaluator boards 40 of FIG. 1 is depicted. The evaluator 40 in FIG. 2 is a multi-stage pipeline architecture which provides for both unit delay logic simulation and time wheel simulation in a single pipelined architecture. As previously described, the dual mode accelerator according to the present invention results in a different pipeline architecture than would the timing simulation mode or a unit delay simulation mode alone. The preferred embodiment of the multi-stage pipelined architecture according to the present invention is a six-stage pipeline to optimize unit delay simulation performance while allowing both modes of simulation to be performed in a single evaluation board.

The six stages of the pipeline architecture according to the present invention will now be described in detail in conjunction with FIG. 2.

First Stage

The first stage of the pipeline is the Event Queue Stage 50 read cycle. At this point in the pipeline, the simulation clock has just advanced to the next simulation time interval and the event(s) which mature during this time interval are read from the Event Queue Memory 60. The net address (unique for each net driver) affected by the maturing event is stored in the Event Queue and is used to "look up" the net activity in the subsequent stages of the pipeline. The queue operation is controlled by the UMODE signal shown in FIG. 2. UMODE selects between the timing mode operation and the unit delay mode operation.

In unit delay mode, the address to the Event Queue Memory is contained in the Stack Counters 56 and 58. One counter contains the address of the current time interval list and the other contains the next time interval list. The events in the lists are stored in the Event Queue Memory 60 and the counter containing the current time interval list address is advanced when each event is removed from the list. The counters are switched when time advances.

In timing mode, the Event Queue Control Logic 62 generates the address for the Event Queue Memory 60. The first access after time advances is the access to the link list pointer array in the Event Queue Memory 60. The address into the point array is determined by the current time (CTIME) variable. The pointer array contains a pointer to the head and the tail of the linked list of events which mature in that time interval. When an event is removed from the queue, the head pointer is used and the memory space is added to the free list. When the list corresponding to the current time interval is exhausted, the simulation time advances to the next time interval.

The Queue Register 70 is the output of Event Queue Stage and holds the net number for the maturing event. (The NV portion of the Queue Register 74 also holds the next value (i.e., the next state and strength) of the net for evaluation of pulse pass devices, as described in cross-referenced patent application entitled "Glitch Detecting Logic Evaluator."

Second Stage

The second stage of the pipeline in FIG. 2 is the Index Map Stage 100. The net number from the Queue Register 70 forms an address into the IMAP Memory 102. IMAP Memory 102 contains the pointer into the Fanout Memory 154 of the Fanout Stage 150 to the base of the fanout list for the net. The fanout list is derived from the netlist of the logic circuit. The indexing scheme allows the number of fanout devices to vary from net to net. This pointer is loaded into the Map Counter 106.

The net number from the Queue Register 70 also addresses the Mode Memory 110. The Mode Memory 110 is written when the netlist is loaded into the accelerator. The Mode Memory 110 contains the information as to whether the net driving device is a pulse pass, pulse suppress or pulse amplify device.

The net number from Queue Register 70 also addresses the location in the Next Value Memory 114, where the next value of the net was written on the evaluation cycle. This next value is used in lieu of the next value from the Event Queue Stage 50 for evaluation of pulse suppress and pulse amplify devices. The output of the Next Value Memory 114 (or the Queue Register 70) is loaded into a register 108, which parallels the Map Counter for timing reasons (i.e., the next value is not used at this stage of the pipe). The Next Value Memory 114 contains the value of the net which was stored when the event was placed in the Event Queue Stage 50.

Third Stage

The third stage of the pipeline is the Fanout Stage 150. The Map Counter 106 of the second stage forms the address into the Fanout Memory 154. The Fanout Memory 154 contains the net numbers and input pin numbers of all devices with inputs connected to the net. This data comes from the circuit netlist. The event maturing in the Event Queue Stage 50 must be sent to all of these connected devices. The Fanout Memory 154 content is loaded into the Fanout Register 156 as the Map Counter 106 is counted once for each of the device inputs connected to the net. The Next Value is loaded into the Fanout Register 156 directly from the Index Map Stage 100 (from the New Value Register 108). No events are removed from the Event Queue Stage 50 as the Map Counter 106 is counted and the fanout devices are evaluated.

Fourth Stage

The fourth stage of the pipeline depicted in FIG. 2 is the Pinlist/Opcode Stage 200. The Fanout Register 156 (net number/pin number of fanout device) sources the address into the Pinlist Memory 204 and the Next Value is the data to be written in the Pinlist Memory 204 at that location. The Pinlist Memory 204 also contains the Opcode of the device to be evaluated. The Pinlist Memory 204 contents are loaded into the Pinlist Register 210 with the net number from the Fanout Register 156.

Fifth Stage

The fifth stage of the pipeline depicted in FIG. 2 is the Evaluation Stage 250. The Pinlist Register 210 contents form an address into the evaluation memory 260. The Opcode portion of the address determines whether the truth table is for a strength evaluation device through Strength Evaluation memory 256, a gate (or state) evaluation device through Gate Evaluation memory 258, or for a memory control device. In the case of a gate evaluation, the Schedule Control Memory 270 may be used to force or prevent the scheduling of the event.

The values of the input pins (from the Pinlist Memory 204) form the remainder of the address which in essence is the truth table look up for the particular device. The contents of the selected address is used to determine the new value for the net. The value is compared in gate 280 with the content of the Last Scheduled Value (LSV) Memory 266 to determine if an event needs to be scheduled (assuming that a schedule is not prevented or forced by schedule control). If an event is to be scheduled, the Last Scheduled Value (LSV) Memory 266 is updated. The output of the Evaluation Stage 250 is the Eval Register 290.

Sixth Stage

The sixth stage of the pipeline is the Event Queue Stage (write cycle). The net number and next value from the Eval Register 290 provide the input for the Event Queue Stage write cycle. The net number forms an address into the Delay Memory 78 where the prop delays of the net driving device are stored. The number of memory cycles required to store the event in the Event Queue is determined by the mode of the simulation (as controlled by UMODE). In unit delay mode, a single cycle is required to store the event since all events mature in the present or the next time interval (the Delay Memory 78 is not used). More cycles are required to store the event in timing simulation since the delays of the device determine the proper time interval in the queue and the list of events scheduled for that time slot must be accessed so that the new event may be inserted.

In unit delay mode, the simulator supports unit delay and zero delay devices. Two lists of events are maintained in memory 60. These lists are addressed by Stack Counters 56, 58. The first event list is the list of events which mature in the current time interval. The second list of events is the list of events which mature in the next time interval. As unit delay devices are evaluated, any resulting event is stored in the next time interval list memory. As zero delay devices are evaluated, any resulting event is stored in the current time interval and causes further evaluation in the current time interval. When the current time interval list is exhausted, simulation time advances to the next time interval and the lists (counters) are switched.

In timing mode, the Event Queue consists of a series of event lists. Each list corresponds to the current or some future time interval. In addition, there is a free list. when an event is stored in the Event Queue memory 60, the delay time (sourced by the Delay Memory 78) is added to the current time (CTIME) by the Event Queue Control Logic 62 to form an address to the link list pointer array in the Event Queue memory 60. The pointer array contains a pointer to the head and the tail of the linked list of events which mature in that time interval. The tail pointer is used to facilitate storing a new event. Since the pointer table address is formed by the addition of the current time to the delay time, the pointers will be correct as time advances.

Note that in both timing and unit delay mode, the net number from the Eval Register 290 forms the address to the NV Memory 114 and the LSV Memory 266. The new value for the net is written at this location in both memories. This value is read from the memories at the appropriate stages of the pipeline as previously described.

What is claimed is:

1. In a logic simulator for simulating a plurality of logic devices, each of said devices having some propagation delay or delays between changes in the input state of said device and a resultant change in the output state of said device, said simulator comprising:

first storage means for storing a first propagation delay for each logic device to be simulated, said first delay being either zero or one simulated time unit;

first simulating means coupled to said first storage for simulating a first zero and unit delay mode of operation utilizing said first stored delay;

second storage means for storing a group of propagation delays for each of said simulated logic devices, said group of stored propagation delays being either zero, one unit, or multiple simulated time units;

second simulating means coupled to said second storage means for simulating a zero, unit and multiple unit time wheel mode of operation utilizing said group of stored delays;

control means for selecting from said first simulating means or said second simulating means either said first zero and unit delay mode of operation or said zero, unit and multiple unit time wheel mode of operation for said simulator; and means responsive to selection by said control means for performing said simulation in either said first zero and unit delay mode of operation or said zero, unit and multiple time wheel mode of operation using a common architecture and a common net list, whereby the average number of memory access cycles required in the simulation of any one of said logic devices is reduced when said first zero and unit delay mode of operation is selected by said control means.

2. A logic simulator for simulating a plurality of logic devices, each of said simulated logic devices having a unique identifying net number, said logic simulator being implemented as a multiple stage pipeline for simulating the logical performance of said logic devices, said pipeline having separate means in each of said stages to perform each of the specific operations required to simulate the function of said logic devices, thereby allowing said operations to be performed simultaneously on a plurality of said simulated logic devices, said means for performing said specific operations including:

index map memory means to store a fanout list pointer for each of said simulated logic devices, said identifying net number being utilized to provide the address in said index map memory means for the appropriate one of said fanout list pointers for a specific simulated logic device;

fanout memory means for storing a list of other of said identifying net numbers which represent all of those simulated logic devices which are connected to the output of each of said simulated logic devices, said fanout list pointer being utilized to provide the addresses in said fanout memory means where said fanout list begins;

pinlist/opcode memory means for storing the input logic state and the logic device type of each of said simulated logic devices, said identifying net numbers produced from said fanout list in said fanout memory means being utilized to generate the addresses in said pinlist/opcode memory means where said input logic state and said logic device type are stored;

evaluation memory means to store the logic function of each of said simulated logic devices, said input logic state and said logic device type provided from said pinlist/opcode memory being utilized to provide the address in said evaluation memory means where the future output state of said simulated logic device is stored;

event queue memory means for storing said identifying net numbers, said event queue memory means being organized into segments which are accessed for events and which represent time intervals of said logic simulator; and event queue control means for storing or retrieving said identifying net numbers to or from said event queue memory means segments, thereby controlling the times at which state transitions occur on the outputs of said simulated logic devices.

3. A logic simulator as in claim 2 including means for performing said simulation in either a first zero and unit delay mode of operation or in a zero, unit and multiple unit time wheel mode of operation.

4. A logic simulator in accordance with claim 1 in which said simulator is implemented as a multiple stage pipeline, said pipeline having a plurality of stages for simultaneously performing specific operations sequenced to simulate said logic devices.

* * * * *